United States Patent [19]
Furukawa

[11] Patent Number: 5,117,145
[45] Date of Patent: * May 26, 1992

[54] SURFACE-ACOUSTIC-WAVE CONVOLVER

[75] Inventor: Katsuo Furukawa, Tokyo, Japan

[73] Assignee: Clarion Co., Ltd., Tokyo, Japan

[*] Notice: The portion of the term of this patent subsequent to Aug. 21, 2007 has been disclaimed.

[21] Appl. No.: 498,352

[22] Filed: Mar. 23, 1990

Related U.S. Application Data

[63] Continuation of Ser. No. 255,103, Oct. 7, 1988, Pat. No. 4,950,935.

[30] Foreign Application Priority Data

Oct. 14, 1987 [JP] Japan .................. 62-259219

[51] Int. Cl.⁵ ........................................ H01L 41/08
[52] U.S. Cl. ........................ 310/313 R; 310/313 A; 310/313 D
[58] Field of Search .......... 310/313 R, 313 A, 313 D; 333/151, 194

[56] References Cited

U.S. PATENT DOCUMENTS 3,950,935  8/1990  Furukawa .................. 310/313 R

FOREIGN PATENT DOCUMENTS 3131038  7/1983  Fed. Rep. of Germany ...... 333/195

Primary Examiner—Mark O. Budd
Attorney, Agent, or Firm—Wallenstein, Wagner & Hattis, Ltd.

[57] ABSTRACT

Disclosed is a surface-acoustic-wave convolver having a toroidal coil connected to each interdigital electrode as a matching and balanced-to-unbalanced converting circuit. The use of the toroidal coil wound on an associated toroidal core permits the reduction of required parts in number thanks to its dual function, and accordingly reduction of manufacturing cost and size of the device. Still advantageously the use of such a toroidal winding permits the suppression of spurious or noise signals in an SAW device.

5 Claims, 4 Drawing Sheets

SURFACE-ACOUSTIC-WAVE CONVOLVER

This is a continuation Ser. No. 07/255,103 filed on Oct. 7, 1988, now U.S. Pat. No. 4,950,935 issued Aug. 21, 1990.

BACKGROUND OF THE INVENTION

1. Field of the Invention

The present invention relates to a surface-acoustic-wave convolver, and more particularly to a matching circuit to be associated with a surface-acoustic-wave device (hereinafter abbreviated as SAW device.)

2. Description of the Prior Art

A matching circuit having an inductance L, a capacitance C and a resistance R is used for the purpose of matching on SAW device to an associated exterior circuit. For example, Japanese Patent Application Public Disclosure No. 56-156015 shows an SAW device having an inductance connected thereacross. This arrangement can cancel the imaginary part of the admittance of the SAW device. In order to effect the necessary matching of the real part of the admittance of the SAW device, for instance, the conductance of 50 ohms, however, it is necessary that the radiation conductance G of the electrode is designed to be equal to 20 mS, and accordingly the electrode opening must be enlarged. As a result the piezoelectric substrate is enlarged in area.

Japanese Patent Application Public Disclosure No. 61-230512 shows that a series-and-parallel arrangement of capacitive and inductive elements constitutes a matching circuit, which can cancel the imaginary part of the admittance of the SAW device and at the same time, can effect the matching of the real part of the admittance of the SAW device. The printing of the series-and-parallel arrangement of capacitive and inductive elements on a piezoelectric substrate will disadvantageously cause enlargement of the substrate.

There are two different feeding systems to the opposite interdigital transducers (hereinafter abbreviated as IDT) of SAW device, balance feeding system and unbalance feeding system. These different systems have merits and demerits. Specifically, the balance feeding system in which the opposite IDTs are electromagnetically coupled in balance, has a cancelling effect, thus advantageously preventing spurious signals. However, it is necessary to provide a balanced-to-unbalanced transformer between each IDT of the SAW device and an exterior signal channel, which is generally of unbalance type. In contrast to this, the unbalance feeding system requires no balanced-to-unbalanced transformer, but there must be provided extra means to suppress spurious signals.

The admittance of the IDT formed on the piezoelectric substrate is given at its center frequency as follows:

$$Y = G + j\omega C_r$$

$C_r$ depends on how the IDT is formed on the piezoelectric substrate. Specifically, assume that the IDT is formed on a thin piezoelectric substrate having a conductive lining on its bottom surface, and then in a balance feeding system if used, the value of $C_r$ is reduced two times as much as that in forming the IDT on a thick piezoelectric substrate having no conductive lining at its bottom. Such reduction is attributable to the grounding function of the lining conductor for high-frequency signals. Also, the former arrangement causes an increase of the electro-mechanical coupling coefficient $K^2$. Still advantageously, the balance feeding which the former arrangement adopts, has an effect to suppress spurious signals.

Usually in an SAW convolver having a piezoelectric substrate such as $Z_n$, O substrate, a balance feeding system is used for the above described reason, and also a matching circuit and a balanced-to-unbalanced transformer are used. The use of the matching circuit and the balanced-to-unbalanced transformer, however, prevents disadvantageously the reduction of the size and cost of the device.

SUMMARY OF THE INVENTION

One object of the present invention is to provide an SAW device which is free of the defects described above, permitting the expansion of frequency band and reduction of loss.

To attain this object an SAW device according to the present invention comprises a semiconductor base, a piezoelectric substrate laid on the semiconductor base, at least one transducer laid on the piezoelectric substrate, and an associated matching circuit essentially comprising a transmission line which has an inductance component to cancel the susceptance $\omega C_r$ of the transducer, and has a capability of balance-to-unbalance conversion.

First, the principles of the present invention is described.

Figure 2:
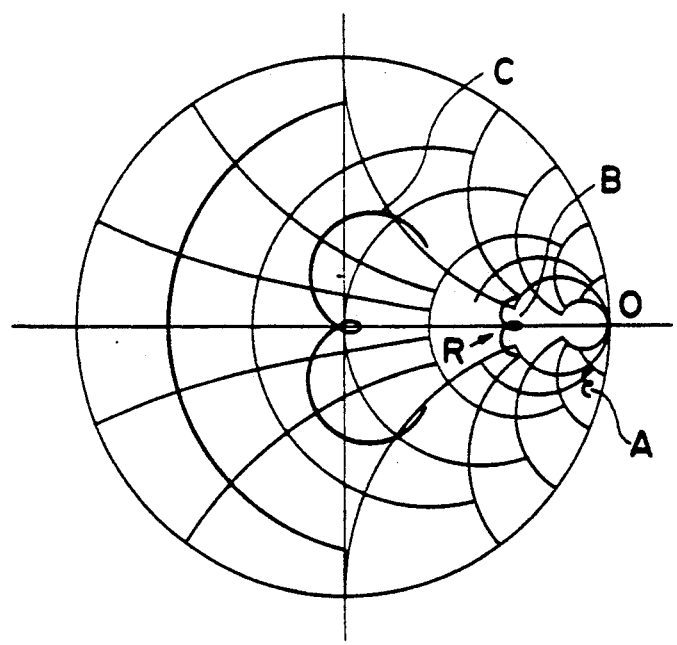
FIG. 2 is a Smith Chart showing the admittance of an IDT.

Generally, the admittance $\dot{Y}$ of the IDT is given at its center frequency as $\dot{Y} = G + j\omega C_r$, where G stands for radiation conductance and $C_r$ stands for the capacitance of the IDT electrode. Its frequency characteristic is indicated at "a" in the Smith Chart of FIG. 2.

Figure 3:
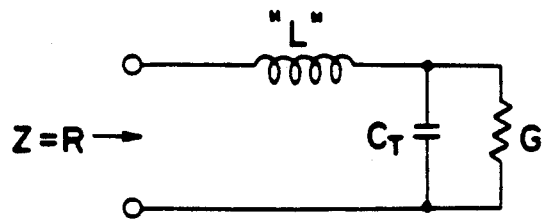
FIG. 3 shows an equivalent circuit of an IDT.

Assume that an inductance L is series-connected to cancel the capacitance $C_r$ of the IDT as shown in FIG. 3, and then, the impedance of the IDT will be resistance R. The frequency characteristic is indicated at "b" in FIG. 2.

Figure 4:
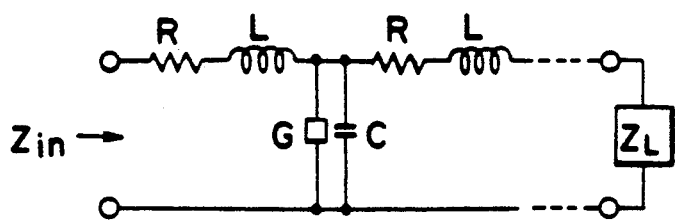
FIG. 4 shows an distributed constant circuit.

Referring to FIG. 4, there is shown a transmission line (characteristic impedance: $Z_o$) having a load $Z_L$ at its receiving end. The impedance $Z_{in}$ as seen from the sending end of the transmission line is given by:

$$\dot{Z}_{in} = \dot{Z}_o \frac{\dot{Z}_o \sinh jl + \dot{Z}_c \cosh jl}{\dot{Z}_o \cosh jl + \dot{Z}_c \sinh jl}$$

If the length of the transmission line is selected to be equal to the fourth of the wave length at the frequency of the acoustic wave (n/4), the above equation will be reduced to $\dot{Z}_{in} = \dot{Z}_o^2/\dot{Z}_L$. For real numbers of impedance $Z_o$ and load impedance $Z_L$ and for $\dot{Z}_{in} = 50$ ohms, the characteristic impedance $Z_o$ of the Transmission line will be given by:

$$Z_o = \sqrt{50 \cdot Z_c}.$$

It also follows from the above equation, as is well known to those knowledgeable in the art, that if the load impedance is in the form of a resistor shunted by a capacitor, the input impedance may be rendered purely real (non-reactive) if the length of the transmission line is set to be appropriately less than one-fourth of the wave length.

Assume that a transmission line whose characteristic impedance $Z_o$ is equal to $\sqrt{50 \, Z_L}$ is connected to the IDT transformer, and then $Z_{in}$ is equal to 50 ohms. Thus, the necessary matching is attained. Specifically, the impedance of the load on IDT, whose characteristics are indicated at "b" in the Smith Chart of FIG. 2, can be matched by adding a transmission line whose characteristic impedance $Z_o$ is equal to $\sqrt{50 \, Z_L}$.

A coaxial cable, parallel feeder or microstrip is not appropriate to the matching use as described above. Instead, a transmission line transformer, which can be advantageously reduced in size, is appropriate for the purpose. Specifically, two transmission line sections are wound on a toroidal core, permitting reduction to the desired operating frequency band thanks to the reduction of wave length inspite of reduction of size and shortening of the transmission line.

Figure 5A:
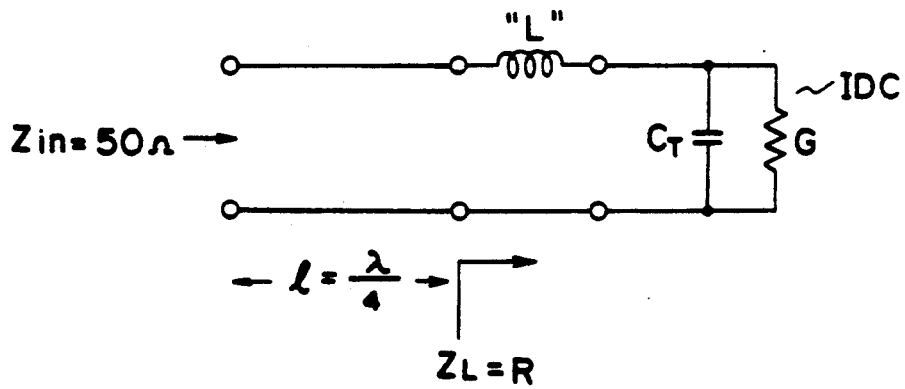
FIG. 5 (a) and 5 (b) show IDTs each connected to a different type transmission line.
Figure 5B:
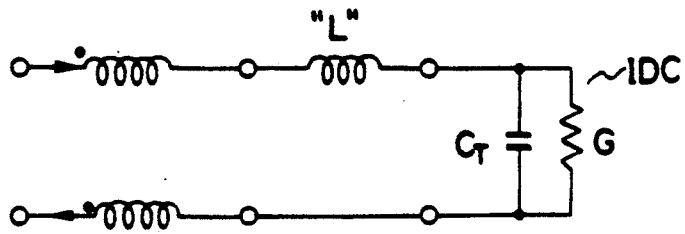

FIG. 5 (a) shows that a transmission line is connected to an IDT. FIG. 5 (b) shows that a transmission line transformer as a transmission line is connected to an IDT. Point markings in FIG. 5 (b) indicate the starting ends of the windings. The windings of the forward and backward-going line sections are wound in opposite directions, thereby causing the magnetic fluxes to cancel each other in the toroidal core.

Figure 6:
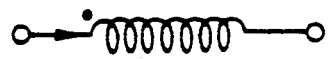
FIG. 6 shows a transmission line transformer.
Figure 6:
Figure 7:
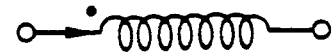
FIG. 7 shows a transmission line-like transformer.
Figure 7:
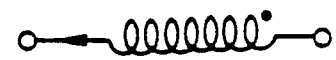

Now, two different transformers are considered. One is a transmission line transformer described above and shown in FIG. 6, and the other (FIG. 7) is a transmission line-like transformer whose windings are wound in the opposite way to those of the former one (FIG. 6).

Figure 8:
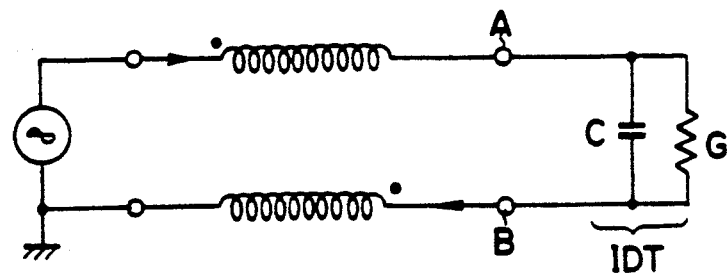
FIG. 8 is a circuit diagram of an IDT connected to a transmission line-like transformer.

The former (FIG. 6) shows the same characteristics as a transmission line whereas the latter (FIG. 7) shows the same characteristics as a transmission line, and at the same time, it has an inductance four times as large as the single winding due to the sum magnetic flux in the toroidal core. The inductance L which is required for matching, is built in the transmission line, as seen in FIG. 8.

A transmission line transformer has an impedance conversion function and a balanced-to-unbalanced conversion function whereas a transmission line-like transformer has an inductance component "L" built therein and a balanced-to-unbalanced conversion function. The phases at places A and B in FIG. 8 were found to be 180 degrees apart from each other at the operating frequency.

A surface-acoustic-wave device according to a preferred embodiment of the present invention will be described below.

Figure 1:
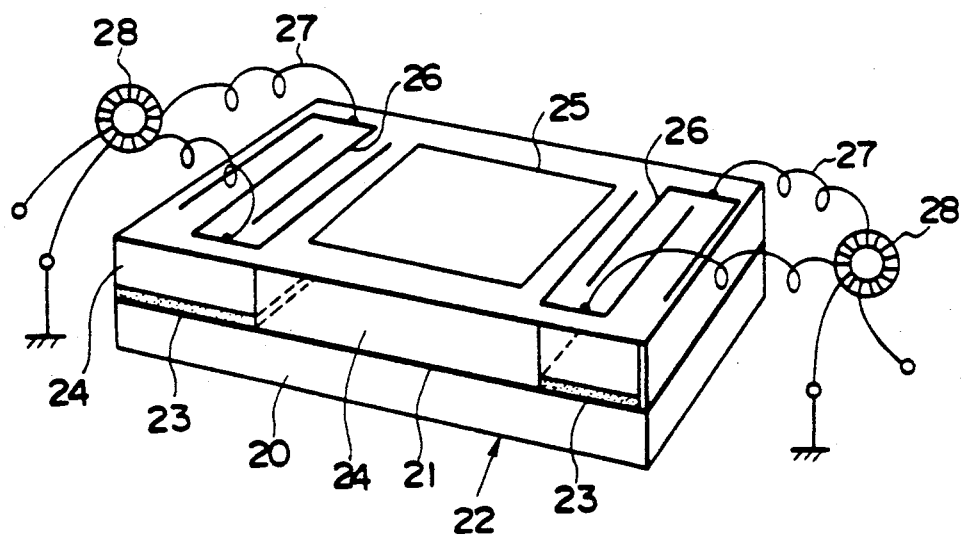
FIG. 1 is a perspective view of an SAW convolver according to the present invention.

FIG. 1 shows a surface-acoustic-wave convolver as comprising an Si (semiconductor) base plate 20, an $SiO_2$ film 21, an ohmic electrode 22, aluminum layers 23, a $Z_nO$ film (piezoelectric substrate) 24, a gate electrode 25, IDT electrodes 26 and transmission-like transformers 28 using toroidal cores. Each transmission-like transformers 28 is connected to an associated IDT by wires 27 as a matching and balanced-to-unbalanced converting circuit. Each IDT electrode has an underlying conductive layer 23 at ground potential.

Figure 9:
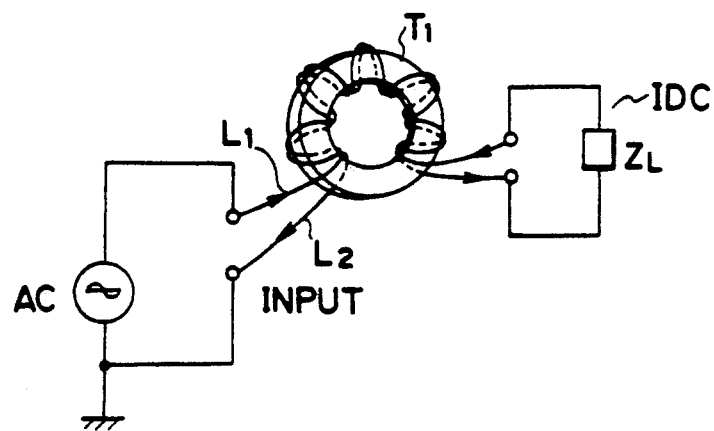
FIG. 9 shows schematically a transmission line-like transformer.

The windings of the forward- and backward-line sections $L_1$ and $L_2$ in the transmission-like transformer in FIG. 9 are wound on a toroidal $T_L$ in opposite directions, thereby providing the sum magnetic flux in the toroidal core.

Figure 10:
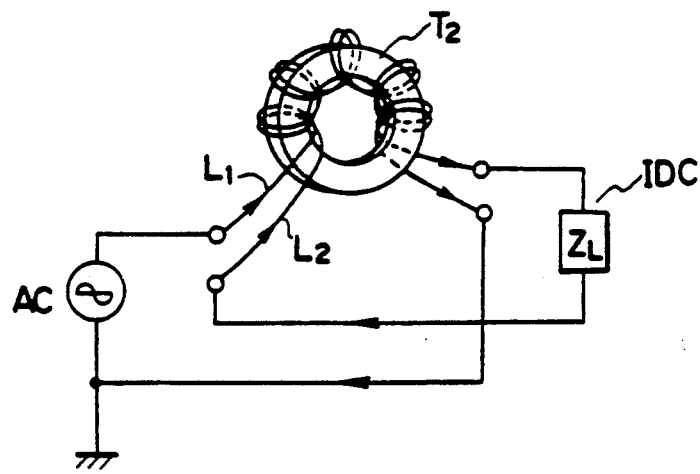
FIG. 10 shows schematically another transmission line-like transformer.

The windings of the forward- and backward-line sections $L_1$ and $L_2$ in the transmission-like transformer in FIG. 10 are wound on a toroidal $T_2$ in one and same direction, and these windings are connected to exterior circuit so as to permit current to flow in one and same direction in the windings, thereby providing the sum magnetic flux in the toroidal core $T_2$.

These different type transmission-like transformers when used as a transmission line and matching circuit, are essentially a two-terminal circuit, and then the inductance as seen from the input towards the closed or short-circuited output end is selected so as to cancel the susceptance $\omega C_r$ of the IDT. The admittance of the IDT when matching is completed is indicated at "c" in FIG. 2.

As may be understood from the above, the following advantages result from the present invention:

1) A $\pi$-circuit or T-circuit which includes L, C and R therein, are used for matching a conventional SAW circuit to an associated exterior circuit, and accordingly the number of the required parts for matching is two or more. In contrast, a single transmission-like transformer attains matching and balance-to-unbalance conversion in an SAW device according to the present invention. Usually, an SAW convolver has two IDTs, and accordingly the number of the required parts for matching and balance-to-unbalance conversion can be reduced from six to two, thereby permitting the reduction both of manufacturing cost and size and weight of an SAW device.

2) The problem of appearance spurious or noise signals will be increasingly conspicuous with the reduction of an SAW device in size. An SAW device according to the present invention uses a toroidal core, and signals in the form of magnetic flux are confined in the toroidal core, and therefore undesired waves are prevented from radiating and disturbing a nearby device. Also, the toroidal core prevents exterior spurious or noise signals from invading and disturbing the signal magnetic flux in the toroidal core. Thus, the transmission line-like transformer constitutes a matching circuit which is free of spurious or noise signals.

As for the leakage of magnetic flux from a toroidal core, such leakage flux can be reduced to minimum or negligible small by evenly winding conductor on the toroidal core.

3) The use of a transmission line-like transformer in an SAW device permits conversion of an unbalanced circuit including a grounding line to a balanced circuit, thereby attaining balance-to-unbalance conversion along with impedance matching. This permits elimination of expensive balanced-to-unbalanced transformers from an SAW device, and accordingly the reduction of manufacturing cost and size.

I claim:

1. A surface-acoustic-wave device comprising:
   a semiconductor base;
   a piezoelectric substrate laid on said base;
   at least one transducer laid on said piezoelectric substrate for converting between electrical signal energy and acoustic wave energy traveling across said substrate and having at least two electrical terminals, said transducer presenting a given electrical impedance at said terminals; and
   a single impedance matching unit having a single core and a pair of transmission lines wound on said core and connected to said transducer, said lines being magnetically coupled to said core and wound thereon so that magnetic fields are produced in the same direction by means of currents flowing into said lines so as to cancel the capacitive resistance of said transducer and to provide a balance-to-unbalance converting function.

2. A device according to claim 1 wherein said transmission line has a length of less than one-quarter line wave length at the frequency of the induced acoustic wave.

3. A device according to claim 1 wherein said core is a toroidal core.

4. A device according to claim 1 wherein said lines are configured as a coaxial line.

5. A device according to claim 1 wherein said device includes at least one interdigital electrode pair.

* * * * *